United States Patent [19]
Mosley et al.

[11] Patent Number: 5,824,950
[45] Date of Patent: Oct. 20, 1998

[54] LOW PROFILE SEMICONDUCTOR DIE CARRIER

[75] Inventors: Joseph M. Mosley; Maria M. Portuondo, both of Boca Raton, Fla.; Drew L. Taylor, Jackson, Wyo.

[73] Assignee: The Panda Project, Boca Raton, Fla.

[21] Appl. No.: 482,000

[22] Filed: Jun. 7, 1995

Related U.S. Application Data

[63] Continuation-in-part of Ser. No. 208,586, Mar. 11, 1994.
[51] Int. Cl.$^6$ .................................................. H01L 23/02
[52] U.S. Cl. .......................................... 174/52.4; 257/678
[58] Field of Search .................................. 174/52.4, 260; 361/728, 729, 730, 736, 748, 760, 761, 772, 773, 774, 777, 820; 257/678, 690, 691, 692, 693, 694, 695, 696, 723, 724, 701, 685, 686, 731

[56] References Cited

U.S. PATENT DOCUMENTS

| | | | |
|---|---|---|---|
| 3,337,838 | 8/1967 | Damiano et al. | 339/217 |
| 3,366,915 | 1/1968 | Miller | 339/19 |
| 3,444,506 | 5/1969 | Wedekind | 339/99 |
| 3,676,748 | 7/1972 | Kobayashi et al. | |
| 3,676,993 | 7/1972 | Bergey et al. | 58/23 |
| 3,806,831 | 4/1974 | Kleinberg | 331/116 R |
| 4,167,647 | 9/1979 | Salera | 174/52 FP |
| 4,331,831 | 5/1982 | Ingram et al. | 174/52.4 |
| 4,423,468 | 12/1983 | Gatto et al. | 361/404 |
| 4,437,718 | 3/1984 | Selinko | 339/61 M |
| 4,487,463 | 12/1984 | Tillotson | 339/17 C |
| 4,572,604 | 2/1986 | Ammon et al. | 339/176 MP |

(List continued on next page.)

FOREIGN PATENT DOCUMENTS

| | | |
|---|---|---|
| 0104051A2 | 3/1984 | European Pat. Off. . |
| 0145694A2 | 6/1985 | European Pat. Off. . |
| 0 155 044 | 9/1985 | European Pat. Off. . |
| 0 438 165 | 7/1991 | European Pat. Off. . |
| 0 467 698 | 1/1992 | European Pat. Off. . |
| 0600750A3 | 6/1994 | European Pat. Off. . |
| 2 664 097 | 1/1992 | France . |
| 3337796 | 4/1985 | Germany . |
| 3430849 A1 | 3/1986 | Germany . |
| 3737819A1 | 5/1988 | Germany . |
| 4021872 | 1/1992 | Germany . |
| 4022829 | 1/1992 | Germany .............................. 174/52.4 |

(List continued on next page.)

OTHER PUBLICATIONS

Dimensional Circuits Corporation, Dimensional Circuits Corp. Awarded Two U.S. Patents, D.C.C. News, Apr. 5, 1994.

Robert Barnhouse, "Bifurcated Through–Hole Technology—An Innovative Solution to Circuit Density," Connection Technology, pp. 33–35 (Feb., 1992).

"AMP–ASC Interconnection Systems," AMP Product Information Bulletin, pp. 1–4 (1991).

"Micro–Strip Interconnection System," AMP Product Guide, pp. 3413–3414 (Jun., 1991).

(List continued on next page.)

*Primary Examiner*—Bot L. Ledynh
*Assistant Examiner*—Kristina Soderquist
*Attorney, Agent, or Firm*—Morgan, Lewis & Bockius LLP

[57] ABSTRACT

A semiconductor die carrier configured to be secured to a printed circuit board includes an insulative package for housing a semiconductor die. The insulative package has a top surface, a bottom surface, and a plurality of side surfaces coupling the top surface and the bottom surface. At least one row of electrically conductive leads extends from at least one of the side surfaces of the insulative package. Each of the leads has a proximal end, at least one horizontal portion extending in a horizontal direction, at least one vertical portion extending in a vertical direction, and a distal end. The distal ends of the leads are configured to be secured to the printed circuit board such that, when the distal ends of the leads are secured to the printed circuit board, at least a portion of the insulative package is located below an upper surface of the printed circuit board.

32 Claims, 14 Drawing Sheets

U.S. PATENT DOCUMENTS

| | | | |
|---|---|---|---|
| 4,616,406 | 10/1986 | Brown | 29/588 |
| 4,655,526 | 4/1987 | Shaffer | 339/74 R |
| 4,660,069 | 4/1987 | Kochanski et al. | 357/68 |
| 4,675,472 | 6/1987 | Krumme et al. | 174/52.4 |
| 4,698,663 | 10/1987 | Sugimoto et al. | 357/81 |
| 4,705,917 | 11/1987 | Gates, Jr. et al. | 174/52 FP |
| 4,734,042 | 3/1988 | Martens et al. | 439/62 |
| 4,766,479 | 8/1988 | Krum et al. | 357/74 |
| 4,897,055 | 1/1990 | Jurista et al. | 439/924 |
| 4,931,908 | 6/1990 | Boucard et al. | 361/395 |
| 4,943,846 | 7/1990 | Shirling | 357/80 |
| 4,975,066 | 12/1990 | Sucheski et al. | 439/63 |
| 4,989,318 | 2/1991 | Utunomiya et al. | 29/827 |
| 4,997,376 | 3/1991 | Buck et al. | 439/59 |
| 5,008,734 | 4/1991 | Dutta et al. . | |
| 5,022,144 | 6/1991 | Hingorary | 29/854 |
| 5,037,311 | 8/1991 | Frankeny et al. | 439/66 |
| 5,049,974 | 9/1991 | Nelson et al. . | |
| 5,071,363 | 12/1991 | Reylek et al. | 439/291 |
| 5,081,563 | 1/1992 | Feng et al. | 361/414 |
| 5,091,772 | 2/1992 | Kohara et al. . | |
| 5,123,164 | 6/1992 | Shaheen et al. | 29/852 |
| 5,137,456 | 8/1992 | Desai et al. | 439/66 |
| 5,138,438 | 8/1992 | Masayuki et al. . | |
| 5,182,853 | 2/1993 | Kobayashi et al. | 29/841 |
| 5,220,491 | 6/1993 | Sugano et al | 361/412 |
| 5,281,151 | 1/1994 | Arima et al. | 439/68 |
| 5,283,717 | 2/1994 | Hundt | 361/813 |
| 5,285,104 | 2/1994 | Kondo et al. | 257/666 |
| 5,309,024 | 5/1994 | Hirano | 257/773 |
| 5,326,936 | 7/1994 | Taniuchi et al. | 174/260 |
| 5,327,325 | 7/1994 | Nicewarner, Jr. | 361/760 |
| 5,334,279 | 8/1994 | Gregoire | 156/630 |
| 5,342,999 | 8/1994 | Frei et al. | 174/266 |
| 5,347,429 | 9/1994 | Kohno et al. | 361/813 |
| 5,351,393 | 10/1994 | Gregoire | 29/835 |
| 5,371,404 | 12/1994 | Juskey et al. | 257/659 |
| 5,376,825 | 12/1994 | Tukamoto et al. | 257/685 |
| 5,390,412 | 2/1995 | Gregoire | 29/848 |
| 5,403,784 | 4/1995 | Hashemi et al. | 437/217 |
| 5,428,505 | 6/1995 | Sakemi et al. | 361/777 |
| 5,438,224 | 8/1995 | Papageorge et al. | 257/777 |
| 5,541,449 | 7/1996 | Crane, Jr. et al. | 257/697 |
| 5,543,586 | 8/1996 | Crane, Jr. et al. | 174/262 |
| 5,659,953 | 8/1997 | Crane, Jr. et al. | 29/843 |
| 5,696,027 | 12/1997 | Crane, Jr. et al. | 437/182 |

FOREIGN PATENT DOCUMENTS

| | | | |
|---|---|---|---|
| 58-66344 | 4/1983 | Japan . | |
| 60-28256 | 2/1985 | Japan . | |
| 62-21249 | 1/1987 | Japan . | |
| 62-81739 | 4/1987 | Japan . | |
| 62-248243 | 10/1987 | Japan . | |
| 64-23560 | 1/1989 | Japan . | |
| 64-74795 | 3/1989 | Japan . | |
| 1-205456 | 8/1989 | Japan . | |
| 2-301182 | 12/1990 | Japan . | |
| 3-151686 | 6/1991 | Japan | 257/695 |
| 4-72750 | 3/1992 | Japan . | |
| 4-147660 | 5/1992 | Japan . | |
| 4-237154 | 8/1992 | Japan . | |
| 5-226803 | 9/1993 | Japan . | |
| 61-5549 | 1/1996 | Japan . | |
| 1245710 | 9/1971 | United Kingdom . | |
| 2 174 538 | 11/1986 | United Kingdom . | |
| 2 196 178 | 4/1988 | United Kingdom . | |

OTHER PUBLICATIONS

"Rib–Cage II Through–Mount Shrouded Headers and Micropax Board–to–Board Interconnect System," Du Pont Connector Systems Product Catalog A, pp. 2–6, 3–0, 3–1, (Feb., 1992).

R.R. Tummala et al., "Microelectronics Packaging Handbook," Van Nostrand Reinhold, 1989, pp. 38–43, 398–403, 779–791, 853–859, and 900–905.

"Packing," Intel Corporation, 1993, pp. 2–36, 2–96, 2–97, 2–100, 3–2, 3–24, and 3–25.

J.W. Balde et al., "New Chip Carrier Package Concepts," Computer, Productivity and Automation, IEEE Computer Society, vol. 10, pp. 58–68, (Dec., 1977).

LOW PROFILE SEMICONDUCTOR DIE CARRIER

CROSS-REFERENCE TO RELATED APPLICATIONS

This application is a continuation-in-part of U.S. patent application Ser. No. 08/208,586 to Stanford W. Crane, Jr. et al. filed Mar. 11, 1994 and entitled PREFABRICATED SEMICONDUCTOR CHIP CARRIER, the content of which is relied upon and hereby expressly incorporated by reference.

BACKGROUND OF THE INVENTION

1. Field of the Invention

The present invention relates to a prefabricated, peripherally-leaded, semiconductor single die or multi-die carrier having a reduced size and extremely low profile, and methods for making and using the semiconductor die carrier. In a preferred embodiment, the low profile semiconductor die carrier has horizontally and vertically spaced rows of multiple leads, with each lead being assembled into the semiconductor die carrier as an individually manufactured lead rather than a sub-element of a lead frame.

2. Description of the Related Art

Conventional package leads are typically configured for mounting using plated-through-hole (PTH) technology or surface-mount technology (SMT). In PTH technology, a conductive PTH is formed in a printed circuit board (PCB). Each lead of a package is inserted through a corresponding PTH and then soldered to form a solder joint fastening the lead in conductive contact with the PTH. In SMT mounting, each lead of a package, rather than being soldered to extend through a PTH in a PCB, is soldered onto a conductive portion of a top surface of the PCB. A solder joint then maintains each lead of the leaded die carrier in a fastened relationship with respect to the PCB.

One type of SMT package is known as a QFP (Quad Flat Package). QFPs are typically manufactured using a molded plastic technology. Most QFPs are manufactured using a single-layer lead frame providing a single row of bent leads extending from each of the four sides of the QFP.

Multi-row lead configurations are also known. For example, it is known to provide two rows of leads, formed by using two different lead frames vertically spaced and insulated from each other, extending from sides of a QFP. It is also known to provide rows of multiple leads formed using vertically spaced lead frames with adjacent rows of leads primarily separated from each other by a gaseous dielectric such as air.

The aforementioned semiconductor die packages suffer from many deficiencies. For example, the molded plastic technology typically used to manufacture QFPs incorporates various processes following the wire bonding procedure which can have detrimental effects on the bonding integrity. Also, the use of lead frames during the manufacturing of QFP semiconductor packages and the like also results in numerous disadvantages.

Moreover, QFP-type packages tend to take up large amounts of PCB area, due in part to the use of lead frames during their manufacture. While multi-row lead frame packages, to some extent, take up less PCB area in terms of the number of leads that can be provided, multi-row lead frame packages are likely to be relatively high in profile and, consequently, are not suitable for incorporation within high volume usage scenarios.

From the foregoing, it can be understood that conventional semiconductor packages take up large amounts of board space; typically have unacceptably high profiles; are expensive and often experience difficulties during manufacture; perform insufficiently due to procedures carried out after chip attachment and wire bonding that tend to inhibit bond integrity; and, after manufacture, are difficult, if not impossible, to repair. As a result of such limitations, current semiconductor packaging technology is not sufficient to meet the needs of existing and/or future semiconductor and computer technology. Semiconductor packaging technology has already failed to keep pace with silicon die technology, and as computer and microprocessor speeds continue to climb, with space efficiency being increasingly important, semiconductor die packages having even smaller area requirements will be required. The semiconductor die packages discussed above fall short of current and contemplated semiconductor and computer requirements.

SUMMARY OF THE INVENTION

Accordingly, it is a goal of the present invention to provide a prefabricated semiconductor die carrier having a low profile while, at the same time, occupying reduced amounts of board area, providing an increased number of contacts, and being capable of meeting the needs of existing and contemplated semiconductor and computer technology.

Another goal of the present invention is to provide a semiconductor die carrier manufactured without the use of lead frames and having leads extending from side portions thereof suitable for mounting using PTH technology, SMT methodology, or pluggable mounting.

Still another goal of the present invention is to provide a semiconductor die carrier that is fabricated and tested prior to placement of a semiconductor die within the carrier, thereby increasing final packaging yields and reducing total unit cost.

It is also a goal of the present invention to provide methods for making and using semiconductor die carriers having characteristics such as those discussed above.

In accordance with the purpose of the invention, as embodied and broadly described herein, the invention includes a semiconductor die carrier configured to be secured to a printed circuit board, the semiconductor die carrier comprising an insulative package for housing a semiconductor die, the insulative package having a top surface, a bottom surface, and a plurality of side surfaces coupling the top surface and the bottom surface; and at least one row of electrically conductive leads extending from at least one of the side surfaces of the insulative package, each of the leads comprising a proximal end, at least one horizontal portion extending in a horizontal direction, at least one vertical portion extending in a vertical direction, and a distal end, the distal ends of the leads being configured to be secured to the printed circuit board such that, when the distal ends of the leads are secured to the printed circuit board, at least a portion of the insulative package is located below an upper surface of the printed circuit board.

It is to be understood that both the foregoing general description and the following detailed description are exemplary and explanatory, and are not restrictive of the invention as claimed. The accompanying drawings, which are incorporated in and constitute a part of the specification, illustrate embodiments of the present invention and, together with the general description, serve to explain the principles of the present invention.

DESCRIPTION OF EXEMPLARY EMBODIMENTS

Figure 1:
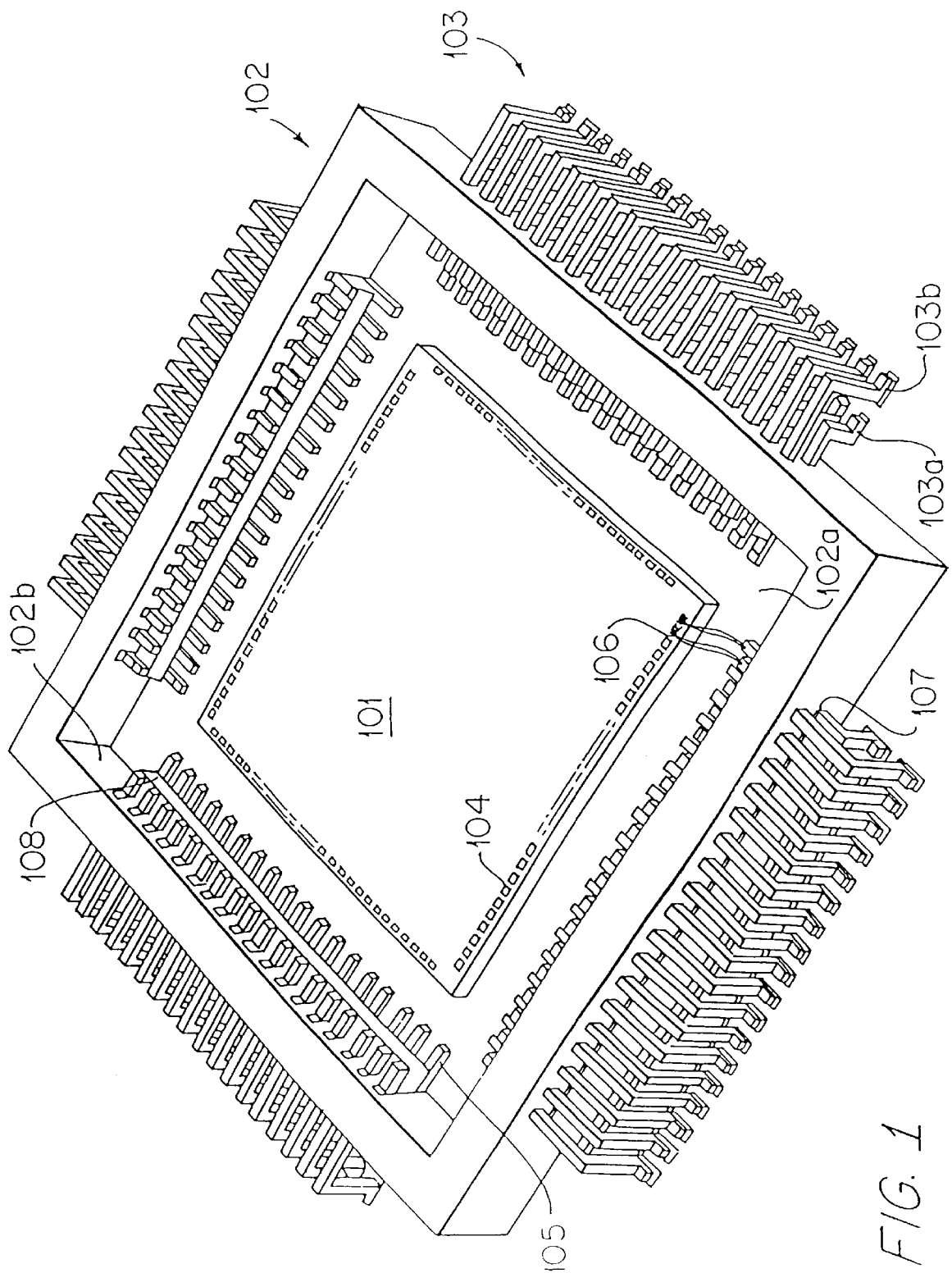
FIG. 1 is a perspective view of a two-tier embodiment of a prefabricated semiconductor die carrier in accordance with the present invention.

A prefabricated semiconductor die carrier in accordance with the present invention is compatible with surface-mount technology and has multiple rows of electrically conductive leads arranged at vertically spaced multiple levels around the periphery of the carrier. The configuration of the die carrier allows the semiconductor die to be bonded from multiple rows of pads on the die to multiple levels of vertically spaced rows of leads while maintaining a very low profile for the die carrier. Each of the leads is manufactured and assembled into the semiconductor die carrier prior to the die attach step as an individually manufactured lead, rather than as a sub-element of a lead frame, to facilitate the multiple-row, multiple-level structure.

The leads of the semiconductor die carrier extend into the die carrier through the side walls of the die carrier, forming a series of vertically spaced rows of multiple leads around the semiconductor die. The portions of the leads extending through the side walls have wire bond terminals formed thereon. A wire bond insulator may be used to separate the rows of leads. The semiconductor die can be mounted within the carrier with the peripheral pads of the die facing up and away from the PCB, in a cavity-up configuration, or with the peripheral pads of the die facing down toward the PCB, in a flip-chip or cavity-down configuration.

Encapsulation for the semiconductor die carrier of the present invention is performed by filling the die cavity with an epoxy, a liquid crystal polymer such as HYSOL (a trademark of Dexter) or similar or other high-temperature material. Alternatively, the semiconductor die carrier may be capped with a plastic component or thermally conductive cap that serves as a heat sink.

The semiconductor die carrier of the present invention provides a package having a reduced size as compared to known semiconductor packages, yet increases the number of interconnects available for the designer and user. The die carrier may be configured to be pluggable, compatible with the PTH technology, or compatible with the SMT methodology. The semiconductor die carrier is prefabricated and tested prior to introduction of the semiconductor die to the carrier, thereby increasing finished product yields and reducing total unit cost. Details relating to the present invention will now be discussed with reference to the accompanying drawings. For the sake of convenience, the same reference numerals will be used to designate the same or similar components of the present invention throughout the accompanying drawings.

A perspective view of an embodiment of a prefabricated semiconductor die carrier in accordance with the present invention is shown in FIG. 1. In accordance with the embodiment of FIG. 1, the semiconductor die carrier includes a semiconductor die 101; an insulating substrate 102, having a floor 102$a$ and a plurality of side walls 102$b$; a plurality of leads 103, including lower leads 103$a$ and upper leads 103$b$; a plurality of bonding pads 104 formed on the semiconductor die; a plurality of bonding terminals 105 formed on the leads 103, respectively; and a plurality of bonding wires 106 each connecting at least one of the bonding pads 104 of the die to a corresponding one of the bonding terminals 105 formed on the leads.

The insulating substrate 102 of the semiconductor die carrier is made of a liquid crystal polymer or material having properties the same or similar to a liquid crystal polymer. Preferably, the liquid crystal polymer for the insulating substrate 102 is VECTRA (trademark), which has a coefficient of thermal expansion that is approximately the same as or similar to the coefficient of thermal expansion for silicon.

The insulating substrate 102 may be formed in a molding process carried out prior to inserting the leads 103 into the side walls 102$b$ of substrate, and prior to mounting the die 101 onto the floor 102$a$ of the substrate. During the molding process, a series of lead holes or passages 107 are molded within the side walls 102$b$ of the substrate, each of the passages for receiving a corresponding one of the leads 103, and a series of ledges 108 are formed inside the side walls of the substrate around the periphery where the die is to be placed. The ledges 108 serve to support the leads 103 (during the wire bonding procedure, for example). As an alternative to forming the lead passage 107 and ledges 108 during the molding process, the lead passages and/or ledges could be added after molding by, for example, removing material of the substrate to form the lead passages and/or by applying insulative material (using an adhesive or epoxy, for example) to form the ledges.

In the embodiment of FIG. 1, the lower leads 103a and upper leads 103b are aligned in a straight line with respect to one another than staggered. In other words, for each upper lead 103b, a corresponding lower lead 103a is positioned directly beneath that upper lead. While not shown in FIG. 3, the lower leads 103a and upper leads 103b could be staggered with respect to one another. In a staggered configuration, none of the lower leads 103a would be beneath any of the upper leads 103b. Instead, progressing along a given one of the side walls 102b, every other lead would be a lower lead 103a or an upper lead 103b.

Figure 2:
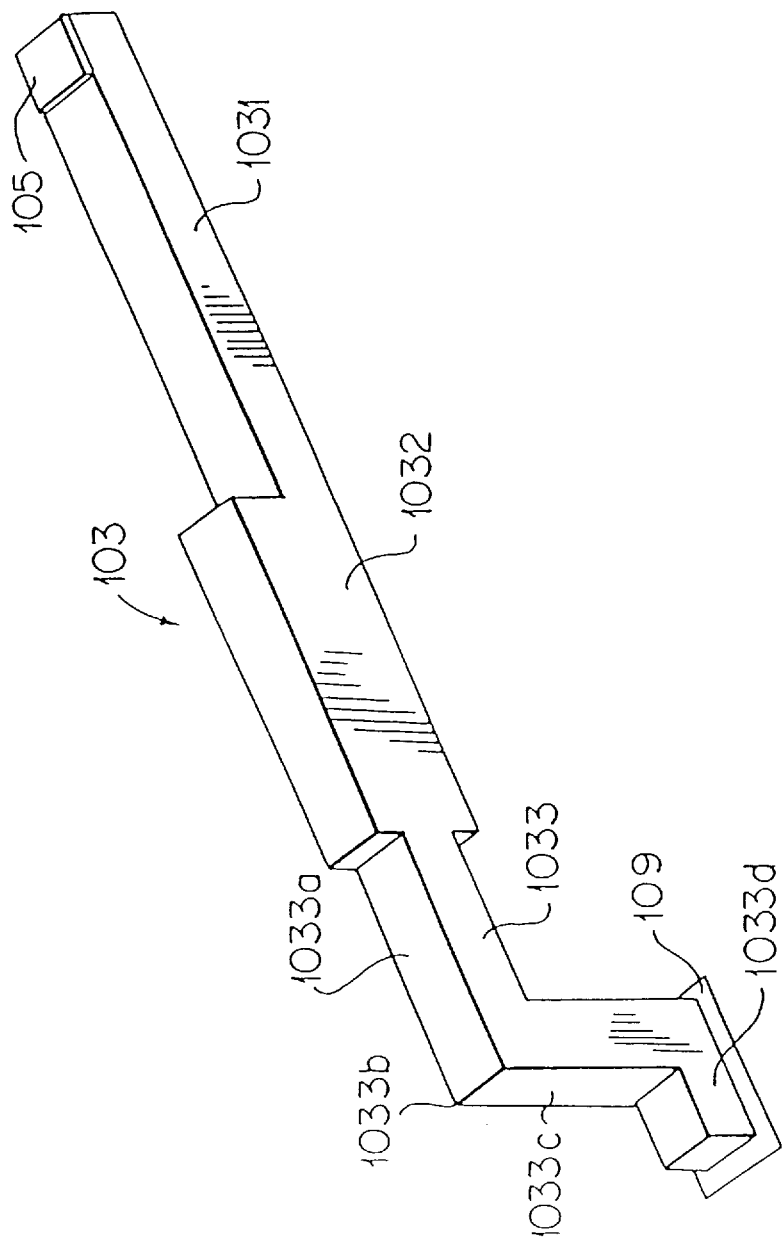
FIG. 2 is a perspective view of an SMT lead with an L-shaped foot portion configured in accordance with the present invention and positioned on a bonding pad of a multi-layer conductor such as a PCB.

A perspective view of an example of one of the leads 103 is shown in FIG. 2. As seen from FIG. 2, each of the leads 103 includes a bonding extension section 1031 having a bonding terminal 105 formed on an end portion thereof; a stabilizing section 1032; and an external lead section 1033. Each lead 103 may be formed of beryllium copper, phosphor bronze, brass, a copper alloy, tin, gold, palladium, or any other suitable metal or conductive material, and the bonding terminal 105 may be a gold-plated pad or pad formed of another suitable conductive material.

The bonding extension section 1031 is a relatively long and narrow portion of the lead 103 which protrudes toward the interior of the semiconductor die carrier from the inner surface of a corresponding one of the side walls 102b. The bonding terminal 105 may be, for example, a bonding pad to which a bonding wire 106 for attachment to a corresponding bonding pad 104 on the die 101 can be connected.

The stabilizing section 1032 of each lead 103 is the portion of the lead that is anchored within a side wall 102b of the substrate 102. The stabilizing section has a larger cross-sectional area than that of the bonding extension section 1031 and may also have a larger cross-sectional area than that of the external lead section 1033. The thick stabilizing section retains the lead and prevents forces exerted on the external lead section from transferring to the bonds associated with bonding wire 106.

The external lead section 1033 includes a horizontally-extending section 1033a, a corner section 1033b, a vertically-extending section 1033c, and a foot section 1033d. The configuration and length of the horizontally-extending and vertically-extending sections for each individual lead 103 are selected based on design requirements and, in particular, based on whether that lead will be used as a lower lead 103a or an upper lead 103b.

Dimensions of the semiconductor die carrier having two vertically spaced rows of multiple leads can be understood, for example, with reference to the accompanying figures.

As can be seen from FIG. 1, for example, a two-row semiconductor die carrier in accordance with the present invention may have, for example, a height of 2.0 mm, a width of 17.9 mm, and a lead row length of 8.7 mm. In this configuration, the semiconductor die carrier of the present invention can be manufactured to be approximately 64% smaller than conventional 128 pin QFPs, and at the same time provides 16 extra leads.

From FIG. 2, it can be understood that a lead 103 in accordance with the present invention may have a bonding extension section 1031 that is 1.5 mm in length; a stabilizing section 1032 that is 1.0 mm in length, and an external lead section 1033 having a vertically-extending section 1033c that varies in length depending whether the lead is an upper lead or a lower lead. As shown in FIG. 2, the foot section 1033d of a lead 103 configured for mounting in accordance with SMT can have a cross-section of 0.2×0.4 mm, for example, for mounting on an SMT solder joint 109 of a PCB having an exemplary cross-section of 0.4×0.6 mm.

Figure 3:
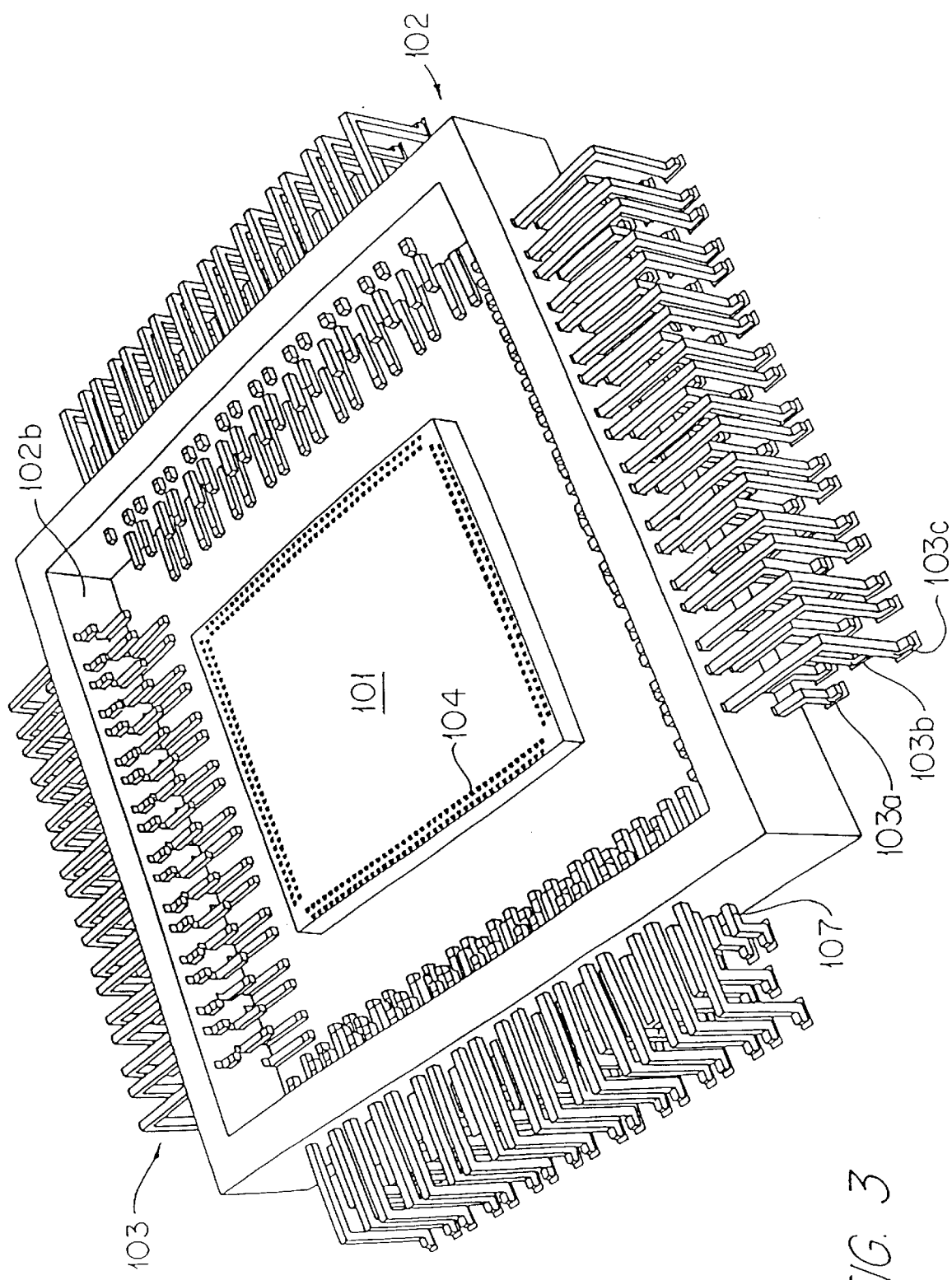
FIG. 3 is a perspective view of a three-tier embodiment of a prefabricated semiconductor die carrier in accordance with the present invention.

A perspective view of another embodiment of a prefabricated semiconductor die carrier in accordance with the present invention is shown in FIG. 3. The embodiment of FIG. 3 essentially corresponds to the embodiment shown in FIG. 1, except that three vertically spaced rows of multiple leads 103a, 103b, and 103c are used instead of two of such rows. Such a configuration enhances the interconnect capabilities of the semiconductor die carrier. While not shown in FIG. 3, ledges 108 might be applicable to the three-row semiconductor die carrier in accordance with the present invention.

The semiconductor die carrier of FIG. 3 may be manufactured in the same manner that the carrier shown in FIG. 1 is manufactured. Exemplary dimensions for the embodiment of FIG. 3 are a height of 2.7 mm; a width of 21.5 mm; and a lead row length of 11.8 mm. In this configuration, the semiconductor die carrier of FIG. 3 can be configured to provide 208 leads using approximately half of the area (for example, board area) of that required by conventional QFP technology.

Figure 4:
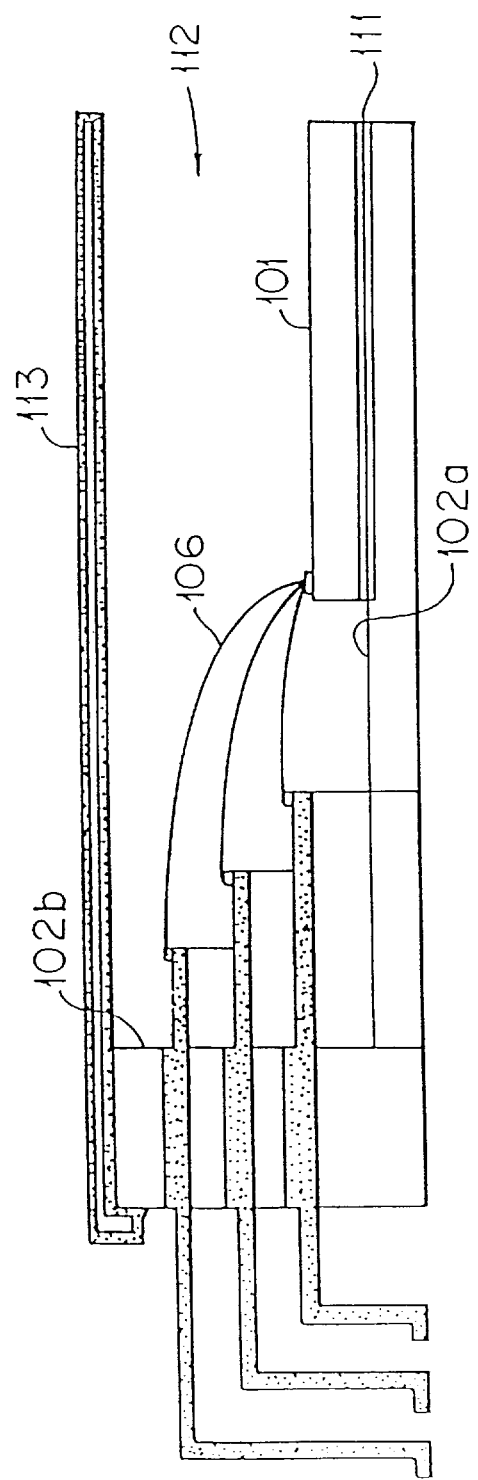
FIG. 4 is a partial side view of a semiconductor die carrier including a cap, cavity-up configuration.

A partial side view of the embodiment of FIG. 3 is shown in FIG. 4. The illustration of FIG. 4 shows features of the semiconductor die carrier including a die bond adhesive 111 for mounting the die 101 on the floor 102a; bonding wires 106 which, in each of the embodiments of the present invention, may be dimensioned to have a wire length of less than 1.0 to 2.5 mm, for example; a cavity filler 112 used to fill the cavity defined by the floor 102a and side walls 102b of the carrier during the encapsulation process; and a sealing cap 113, made of plastic or other thermally-conductive material such as metal or VECTRA (trademark), and capable of functioning as a heat sink, for providing a cover for the semiconductor die carrier.

Figure 5:
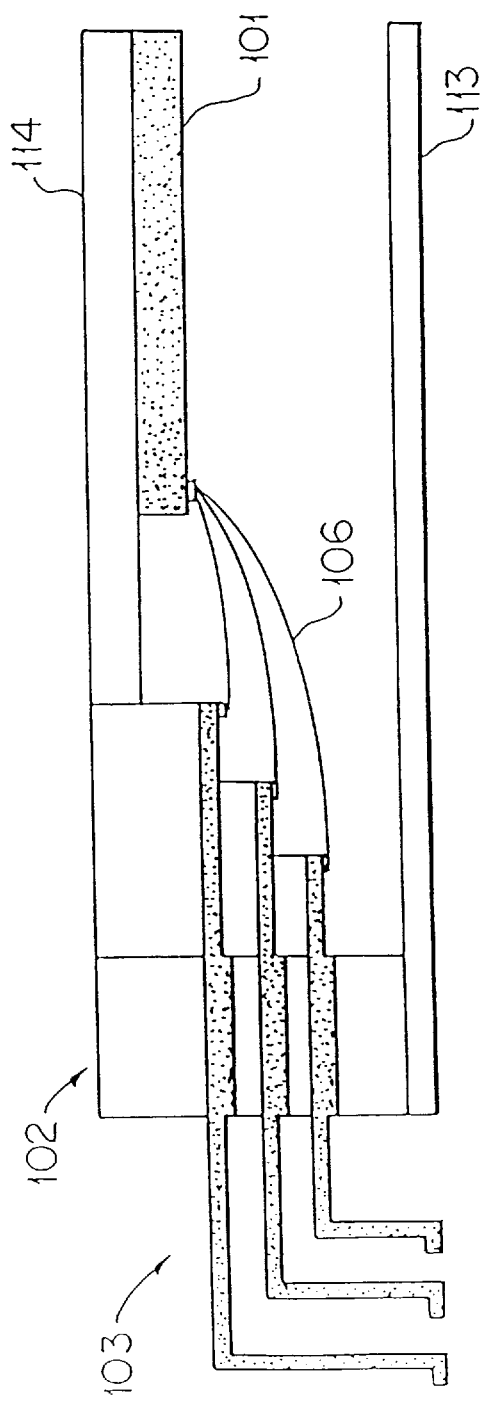
FIG. 5 is a partial side view of a semiconductor die carrier having a cavity-down configuration.

FIGS. 5–8 show various configurations relating to the placement of the semiconductor die 101 within the semiconductor die carrier. Although FIGS. 5–8 depict an embodiment having three-row configuration, it should be noted that the die placement configurations illustrated in these figures are also applicable to the other embodiments of the present invention, including the one-row and two-row embodiments discussed above and the four-row embodiments discussed below.

Where FIG. 4 corresponds to a cavity-up configuration, in which the semiconductor die is mounted within the carrier with the peripheral pads of the die facing up and away from the PCB or other mounting surface, FIG. 5 corresponds to a cavity-down or flip-chip configuration, in which the peripheral pads of the die face down toward the PCB or other interface surface. In the configuration of FIG. 5, the die 101 is mounted on a heat sink cap 114, preferably formed of a thermally conductive material, and then wire bonding, encapsulation, and sealing using a sealing cap 113, preferably formed of VECTRA (trademark), take place. The heat sink cap 114 can be an integrally molded component of the substrate 102, or attached to the substrate 102 after molding of the substrate is completed.

Figure 6:
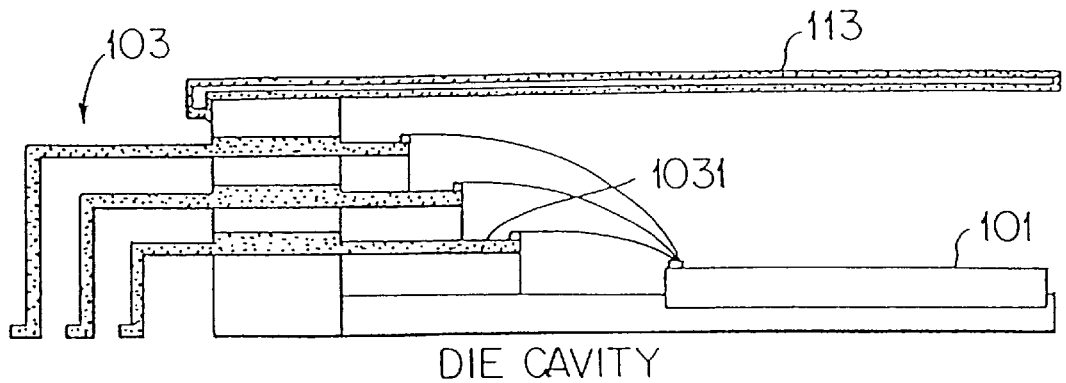
FIG. 6 is a partial side view of a semiconductor die carrier having a die indentation configuration and including a cap.

FIG. 6 shows that the semiconductor die 101 may be embedded or placed into an indentation, similar to the size of the semiconductor die, formed in the floor 102a for receipt of the die. In this configuration, the top surface of the die is located below the bonding extension sections 1031 of the lower leads 103a.

Figure 7:
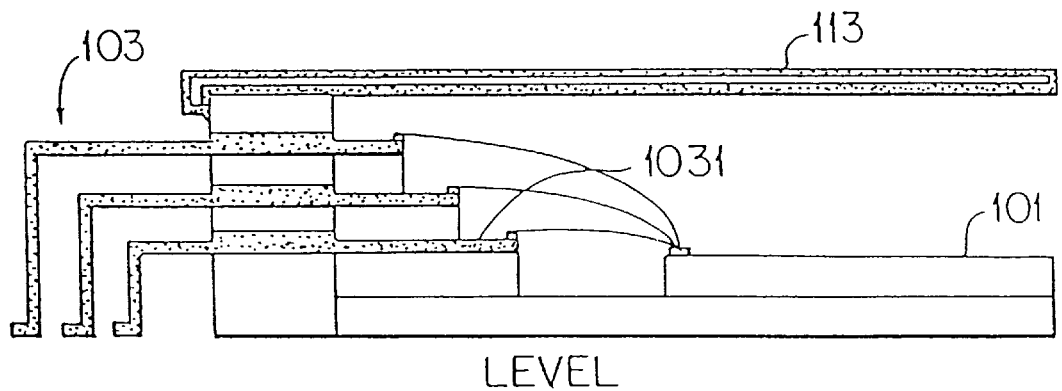
FIG. 7 is a partial side view of a semiconductor die carrier having a same or similar level configuration and including a cap.

FIG. 7 shows the placement of the semiconductor die 101 on top of a flat floor 102a. In this configuration, the top surface of the semiconductor die 101 is the same level or similar in height to the height of the bonding extension sections 1031 of the lower leads 103a.

Figure 8:
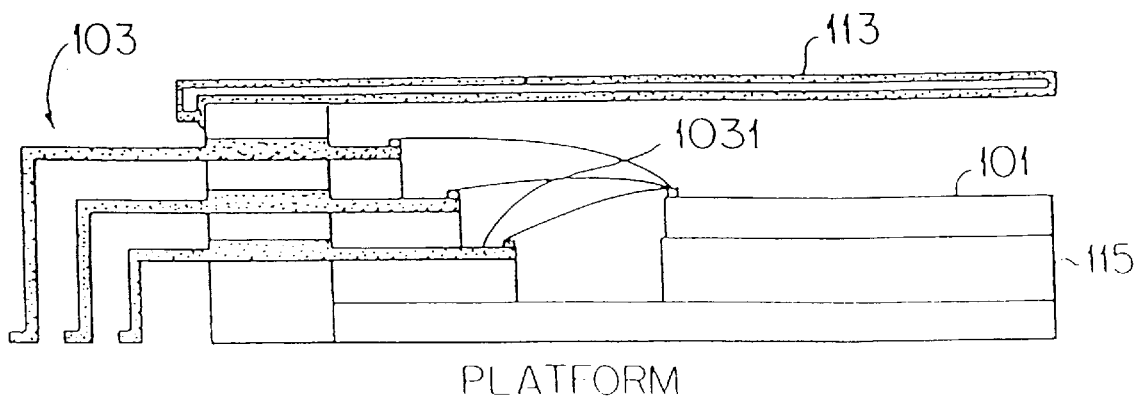
FIG. 8 is a partial side view of a semiconductor die carrier having a platform configuration and including a cap.

FIG. 8 shows the placement of the semiconductor die 101 on a raised platform 115, similar to the size of the die, formed in the interior of the semiconductor die carrier. The raised platform 115 may be an integrally molded component of the substrate 102, or attached to the substrate 102 after molding of the substrate is completed.

It should be noted that, in each of the configurations shown in FIGS. 5–8, the semiconductor die 101 may be mounted using an adhesive material, epoxy, or the like.

Figure 9:
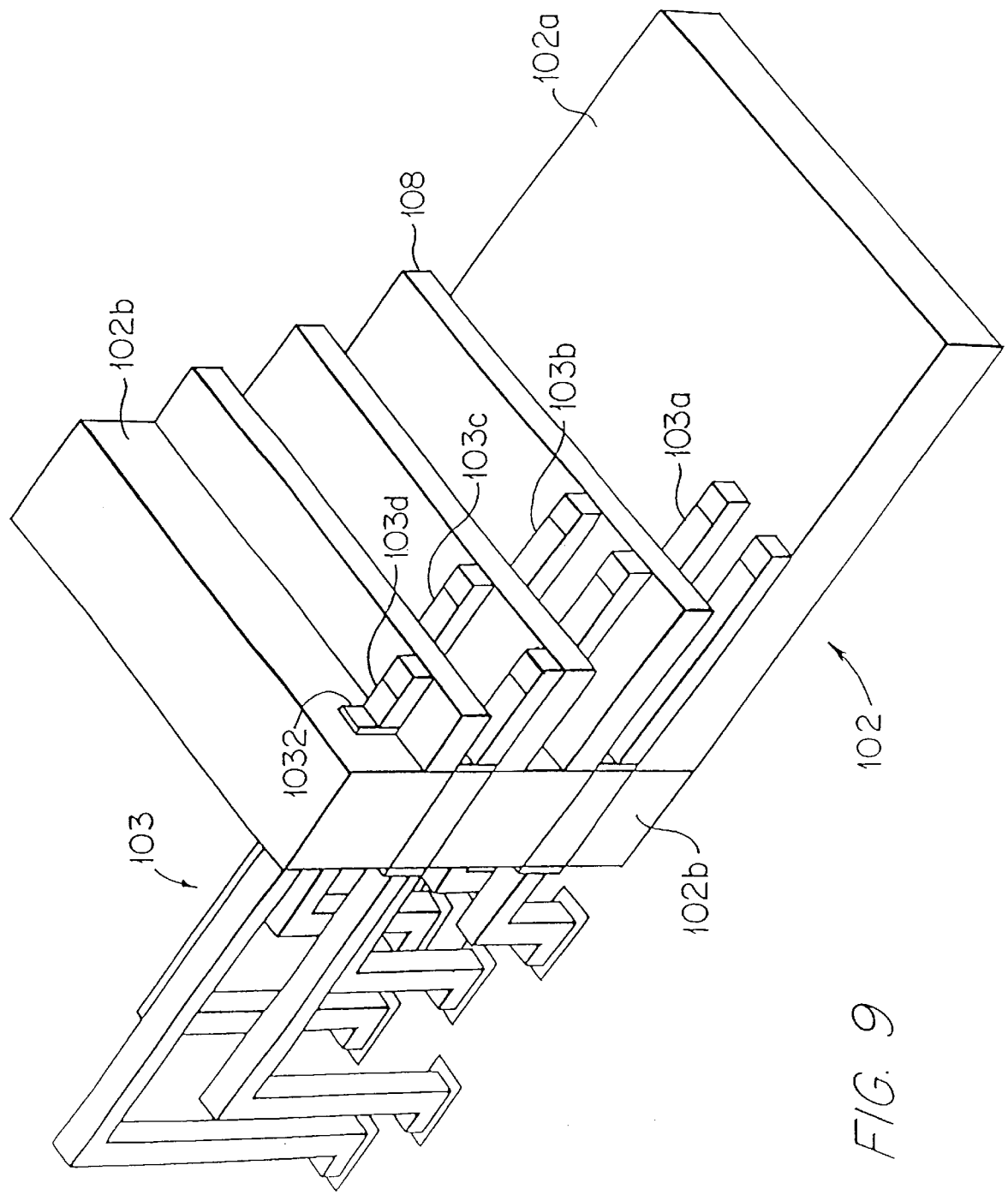
FIG. 9 is a partial perspective view of a four-tier embodiment of a prefabricated semiconductor die carrier in accordance with the present invention.

A partial view of another embodiment of a preferred semiconductor die carrier in accordance with the present invention is shown in FIG. 9. The embodiment of FIG. 9 essentially corresponds to the embodiments shown in FIGS. 1 and 3, for example, except that four vertically spaced rows of multiple leads 103a, 103b, 103c, and 103d are used instead of two or three of such rows. Such a configuration further enhances the interconnect capabilities of the semiconductor die carrier. FIG. 9 illustrates that, in all the embodiments of the present invention, the stabilizing section 1032 of each lead 103 may overlap or extend beyond the inner surface of its corresponding side wall 102b, if desired. Alternatively, in all of the embodiments of the present invention, a stop could be used to prevent over-insertion of the leads.

The semiconductor die carrier of FIG. 9 is manufactured in the same manner that the die carriers shown in FIGS. 1 and 3 are manufactured. Exemplary dimensions for the embodiment of FIG. 9 are a height of 3.4 mm; a width of approximately 28.0 mm; and a lead row length of 16.2 mm. In this configuration, the semiconductor die carrier of FIG. 9 can be manufactured to be approximately 57% smaller than conventional 304-pin QFPs.

The previously-discussed embodiments and configurations in accordance with the present invention contemplate a prefabricated semiconductor die carrier having one row of multiple leads or two, three, or four vertically spaced rows of multiple leads. While not shown in the accompanying drawings, in accordance with the present invention, prefabricated semiconductor die carriers having five or more vertically spaced rows of multiple leads are also contemplated. Such prefabricated semiconductor die carriers are considered to be within the spirit and scope of the present invention.

Figure 10:
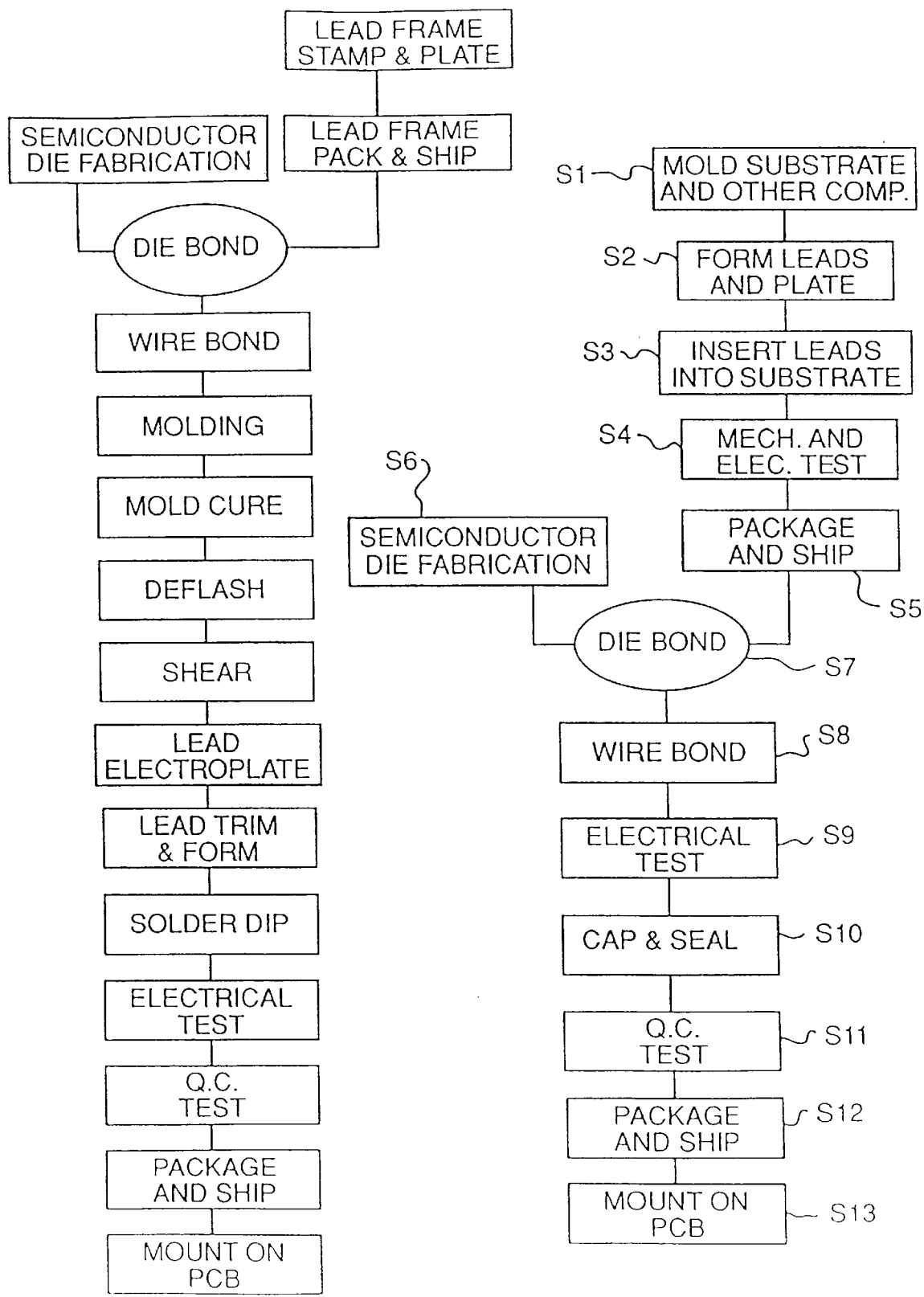
FIG. 10 depicts a pair of flowcharts comparing a conventional manufacturing method with a method in accordance with the present invention performed in order to manufacture, transport, and mount a prefabricated semiconductor die carrier.

FIG. 10 includes two flowcharts. The flowchart at the left illustrates steps performed in the manufacturing of a conventional molded plastic semiconductor package. The flowchart at the right illustrates steps performed in a manufacturing process for producing a prefabricated semiconductor carrier in accordance with the present invention. As can be seen from FIG. 10, the present invention entails fewer steps following the die bond procedure as compared to conventional manufacturing processes. Most notably, the molding, mold cure, deflash, shear, lead electroplate, lead trim and form, and solder dip steps of the conventional manufacturing process are completely absent from the manufacturing process of the present invention following die bonding. The result is that the costly yield losses associated with the conventional process are completely avoided by the manufacturing process of the present invention.

In accordance with the present invention as depicted in the rightward flowchart of FIG. 10, in a step S1, the substrate 102, including the floor 102a and side walls 102b and, if desired, lead passages 107 and ledges 108, are integrally formed using a molding process. As an alternative to forming the lead passages 107 and ledges 108 during the molding process, the lead passages and/or ledges could be added after molding by, for example, removing material of the substrate to form the passages and/or by applying insulative material (using an adhesive or epoxy, for example) to form the ledges. Moreover, it is envisioned that rather than being formed integrally in a single molding process, the floor 102a and side walls 102b could be molded separately, and then fastened together using an epoxy or other adhesive. The use of VECTRA (trademark) as the material for the substrate allows the parts of the semiconductor die carrier to be molded and assembled with a high degree of accuracy. As an alternative to forming the substrate 102 and then inserting the leads into the substrate, the substrate could be formed around the leads in an insert molding process.

In a step S2, the leads 103 are formed. The lead formation step S2 entails punching or stamping out individual leads from strips or drawn wire using, for example, a die. Applicants have found that by individually manufacturing each lead 103, rather than using a lead frame to manufacture such leads, manufacturing costs are reduced and, at the same time, yield is increased.

The aforementioned lead-manufacturing methods allow for selective plating and automated insertion. The leads for stamping can either be loose, on a bandolier carrier, or on a strip since the asymmetrical shape lends itself to consistent orientation in automated assembly equipment. The different length external lead sections assist with orientation and vibratory bowl feeding during automated assembly. The present invention is compatible with both stitching and gang-insertion assembly equipment. The insulative components have been designed to facilitate automatic and robotic insertion onto PCBs or in termination of wire to connector.

Step S3 of FIG. 10 involves inserting the leads 103 into the side walls 102b of the substrate 102. In the situation where the floor 102a and the side walls 102b are formed separately and then fastened together at a later time, the leads may be inserted into the side walls before they are fastened to one another or to the floor. Each of the leads 103 is inserted into a corresponding one of the lead passages 107 in the side walls 102b. The dimensions of the leads 103 and lead passages 107 are such that each lead fits tightly within its corresponding lead passage 107. However, if desired, each lead 103 can be further fastened within its corresponding lead passage 107 and/or onto a corresponding ledge 108 using an epoxy or other adhesive material.

It should be kept in mind that rather than forming the substrate and then inserting the leads into the side walls of the substrate, placement of the leads 103 with the side walls 102b of the substrate may be accomplished using an insert molding process. Insert molding is applicable to all embodiments of the present invention.

In step S4, mechanical testing is performed to ensure that the leads 103 are securely fastened within the substrate 102; to ensure that coplanarity of the leads 103 falls within an acceptable range; to ensure that each lead is aligned properly within its respective lead passage; and the like. Also, electrical testing is performed to ensure that signals can be transmitted properly through the leads of the carrier to the exterior of the carrier, and vice versa; and to ensure that none of the leads are shorted or would be likely to short during subsequent stages of the manufacture and usage of the semiconductor die carrier. In accordance with step S5, the substrate 102 having leads 103 disposed therein is packaged and then shipped to the place where a semiconductor die, manufactured in step S6, will be bonded to the substrate.

Step S7 of FIG. 10 involves attaching the semiconductor die 101 to floor 102a or another support surface (for example, a raised platform 115) within the semiconductor die carrier. The attachment may be carried out using an adhesive, an epoxy or the like.

Step S8 entails a bonding procedure wherein a bonding wire 106 is connected between components of a pair including a bonding pad 104 on the die 101 and a bonding terminal 105 on one of the leads 103. The bonding wires allow electrical connection between the die 101 and the various leads 103.

In step S9, further electrical tests may be performed to provide additional assurance that an acceptable product is being manufactured. In step S10, encapsulation is performed by filling the cavity defined by the floor 102a and the side walls 102b of the substrate 102 with epoxy, a liquid crystal polymer such as VECTRA (trademark), or other high-temperature material. Then the semiconductor die carrier may capped with a plastic component or thermally-conductive cap that may serve as a heat sink, and thereafter sealed, although use of a cap is optional. It should be noted that when a cap is used, the aforementioned encapsulation step becomes optional. The heat sink and/or high-temperature material which may be used for encapsulation and sealing facilitate the heat dissipation capabilities of the semiconductor die carrier. In step S11, further mechanical and electrical quality control testing may be performed to increase the likelihood that the semiconductor die carrier will function as expected.

In accordance with step S12, the completed semiconductor die carrier is packaged and shipped to the customer. Preferably, the semiconductor die carrier is packaged and shipped to the customer using the same transportation package it was received in.

Step S13 relates to the mounting of the finished semiconductor die carrier on or within an interface surface such as a PCB surface. In step S13, either PTH technology or SMT methodology may be used to accomplish PCB interfacing or, alternatively, the carrier may be plugged into a pluggable socket mounted on a PCB or other interface device.

The configurations of the footprints of the semiconductor die carrier (or of the pluggable socket, if one is used) facilitate the routing of traces on the PCB or other interface surface onto or within which the semiconductor die carrier is being mounted. Further mechanical and electrical testing can be performed after the mounting process is completed.

As compared to conventional methods, there are significantly fewer production steps involved in producing a semiconductor die carrier in accordance with the present invention. The semiconductor die carrier of the present invention begins as a pre-formed platform into which the die is inserted. Encapsulation is then accomplished by capping and sealing the platform after it has been tested. This results in the elimination of the entire molding, bending, and clean-up processes and the related bonding of the carrier. Because the leads of the present invention are pre-formed and inserted into the plastic platform, they are undisturbed by additional procedures conventionally performed after the die is introduced into the semiconductor package. In the conventional process, the most sensitive aspects of the manufacturing process, encapsulating the die and electroplating and forming the leads, are performed after the die and the semiconductor package have been mated. This results in comparatively costly scrap, which may be due to lack of coplanarity among the leads, breakage, wire bond failure due to high-pressure molding, or other problems. All of these problems result in sacrificing the die as well as the package. The semiconductor die carrier of the present invention, however, could be delivered to the die attach area completely tested for plating, mechanical integrity, and dimensional characteristics, and the die need only be inserted into packages meeting acceptable quality standards. The elimination of the intermediate processes also reduces labor costs.

The semiconductor die carrier of the present invention can be configured with a precise number of leads easier than current designs due to the programmable nature of its assembly. A designer can specify varied numbers of leads or changes in package size, without the need to design and manufacture new lead frame configurations. With the present invention, both the number of leads on a side of a package, and the number of rows of leads, can be varied simply by producing a new mold for the prefabricated platform and reprogramming the lead insertion equipment to vary the number of leads or lead configuration.

Figure 11A:
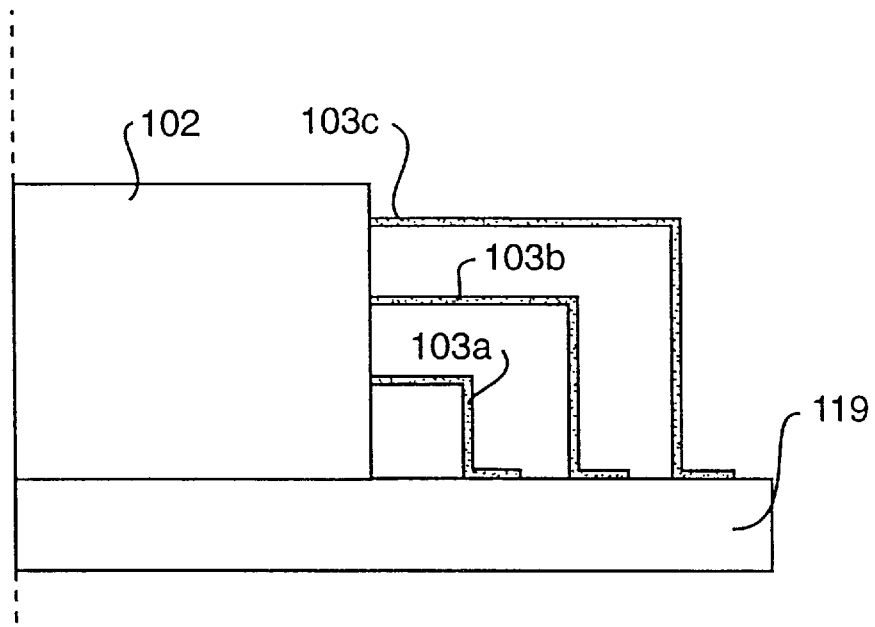
FIGS. 11($a$) and 11($b$) are each a side view of an embodiment of a low profile semiconductor die carrier in accordance with the present invention.

FIG. 11(a) illustrates that the embodiments of the present invention (e.g., the 3-tier embodiment of FIG. 3) provide a low profile configuration suitable for use in a variety of different environments. For example, as can be seen from FIG. 11(a), when a semiconductor die carrier module having an insulative substrate 102 which is 3.3 mm thick is mounted to a PCB card 119 which is 1.52 mm thick, the overall profile of the combination has a height of 3.82 mm (3.3 mm+1.52 mm). Although this height is more that suitable in many applications, for some high volume usage scenarios, a profile of this dimension is just too high.

Figure 11B:
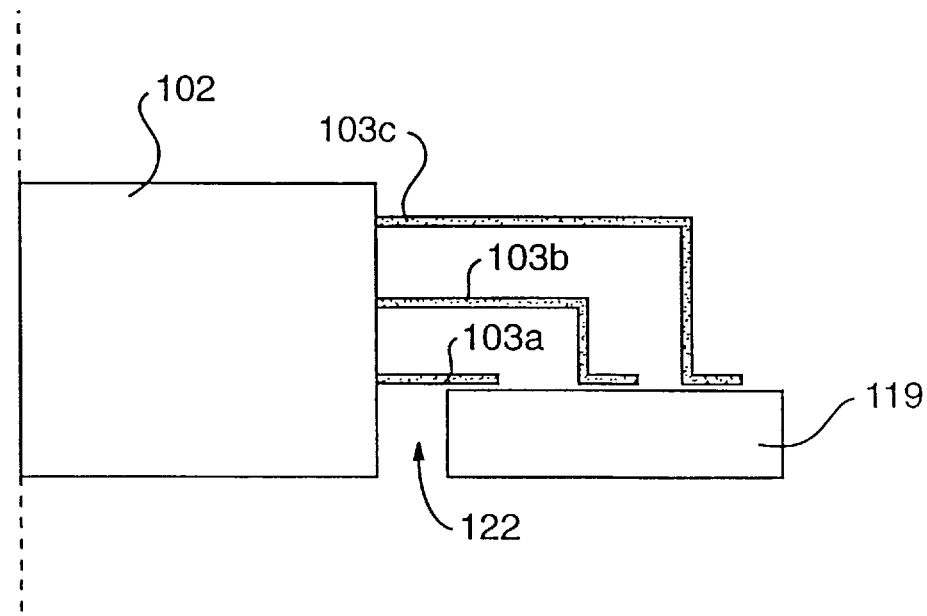

The height of the profile of the semiconductor die carrier of the present invention can be reduced even further by pushing or submerging the body of the semiconductor die carrier into an aperture 122 punched into the PCB. Such an embodiment is shown in FIG. 11(b). With reference to FIG. 11(b), when semiconductor die carrier 102 and PCB 119 are secured such that a portion of the semiconductor die carrier is located below the level of the upper surface of the printed circuit board, a combination having a thickness of 1.78 mm (3.3 mm−1.52 mm) or lower can be obtained.

In order to push the semiconductor die carrier module into PCB 119 in the manner of FIG. 11(b), a hole 122 must be punched into the PCB before the semiconductor die carrier is secured to it. This results in essentially a total loss of wiring beneath the die carrier. Thus, there is a trade-off between lowering the profile of the semiconductor die carrier and the extent to which the semiconductor die carrier can be provided with optimum wiring characteristics. In configurations where wiring beneath the semiconductor die carrier is required, then the submerged embodiment of FIG. 11(b) is probably not the optimum solution. In other common configurations, however, such as in PCMCIA (Personal Computer Memory Card International Association) and PDA (Personal Digital Assistant) applications, for example, where wiring to and from the semiconductor die carrier is the norm, the submerged embodiment is definitely viable.

Figure 12:
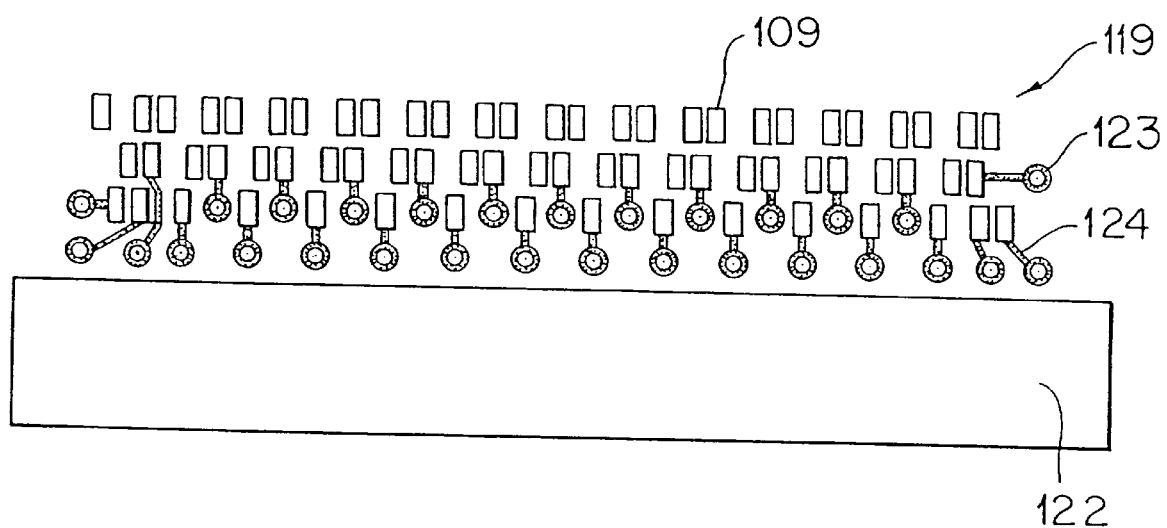
FIG. 12 is a partial top view of a low profile embodiment of the invention such as that depicted in FIG. 11($b$) showing footprint details.

FIG. 12 is a top view consistent with the embodiment of the invention illustrated in FIG. 11(b), showing a portion of the aperture 122 punched into PCB 119 to accommodate the semiconductor die carrier, and details relating to the footprint of the leads of the semiconductor die carrier on PCB 119, including locations of SMT solder joints 109, vias 123, and traces 124 connecting various ones of the vias and SMT solder joints. As seen from FIG. 12, the embodiment of FIG. 11(b) may require the placement of vias 123 where formerly there were SMT solder joints, such as in the row adjacent aperture 122 and throughout the row of bonding pads closest to the aperture. Nevertheless, such an embodiment still provides a semiconductor die carrier having at least 276 leads, which is three more than a standard PGA module having 273 leads, while at the same time providing a low profile of unprecedented dimension. In other words, an extremely low profile module is provided without sacrificing any loss and, in fact, experiencing a gain, in the amount of available leads. It should be noted that with respect to the embodiment depicted in FIG. 12, the leads may be required to be extended away from the module in order to span the various vias 123 adjacent aperture 122.

Figure 13A:
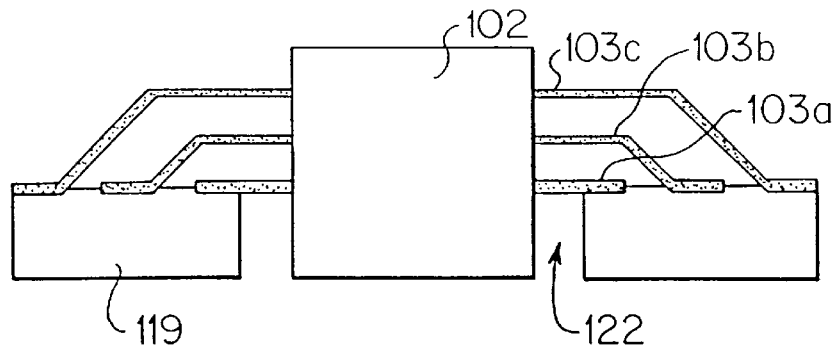
FIGS. 13($a$) and 13($b$), are each a side view of an embodiment of a low profile semiconductor die carrier in accordance with the present invention.
Figure 13B:
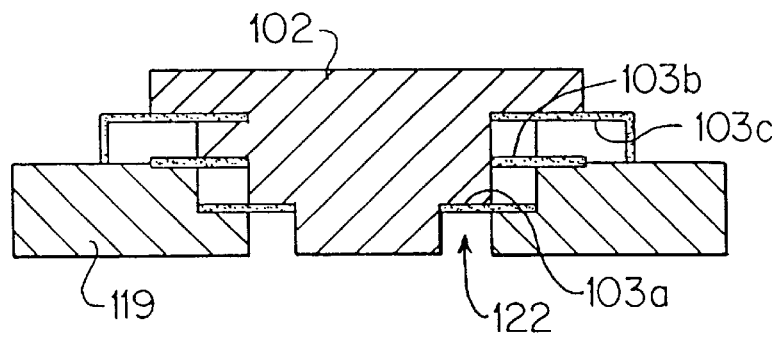

FIGS. 13(a) and 13(b) depict embodiments of the present invention in which, in essence, are modifications of the embodiment depicted in FIG. 11(b).

The embodiment of FIG. 13(a), for example, is similar to the embodiment of FIG. 11(b), wherein a straight or completely vertical aperture 122 is used, except that in FIG. 13(a) leads 103b and 103c are bent at a more gradual angle than the right angle depicted in FIG. 11(b). Leads 103a, however, extend straight out from the insulative body 102 of the semiconductor die carrier without bending in both FIGS. 11(b) and 13(a).

Rather than using a straight aperture such as the one depicted in FIG. 13(a), a stepped aperture 122 in combination with a stepped semiconductor die carrier can be used in the manner depicted in FIG. 13(b). The stepped aperture 122 of FIG. 13(b) formed during assembly of PCB 119, especially when used in combination with a semiconductor die carrier having a stepped insulative package 102, is considered to be more advanced and provides an ultra low profile which can be incorporated in high volume usage scenarios. In the extremely low profile embodiment of FIG. 13(b), each of the steps of the aperture 122 is provided with a plurality of electrically conductive contacts (not shown in FIG. 13(b)) which mate with the rows of leads 103a, 103b, and 103c formed on the steps of the semiconductor die carrier.

Figure 14A:
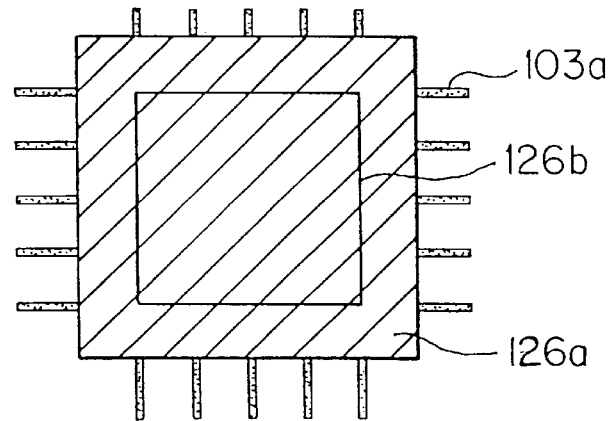
FIGS. 14($a$) and 14($b$) are top and side views, respectively, of an embodiment of a low profile semiconductor die carrier in accordance with the present invention.
Figure 14B:
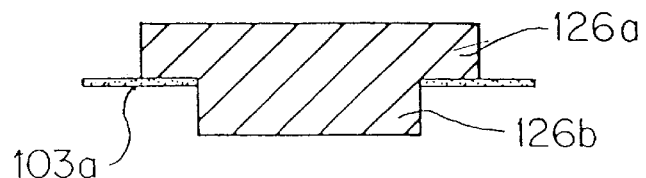
Figure 15A:
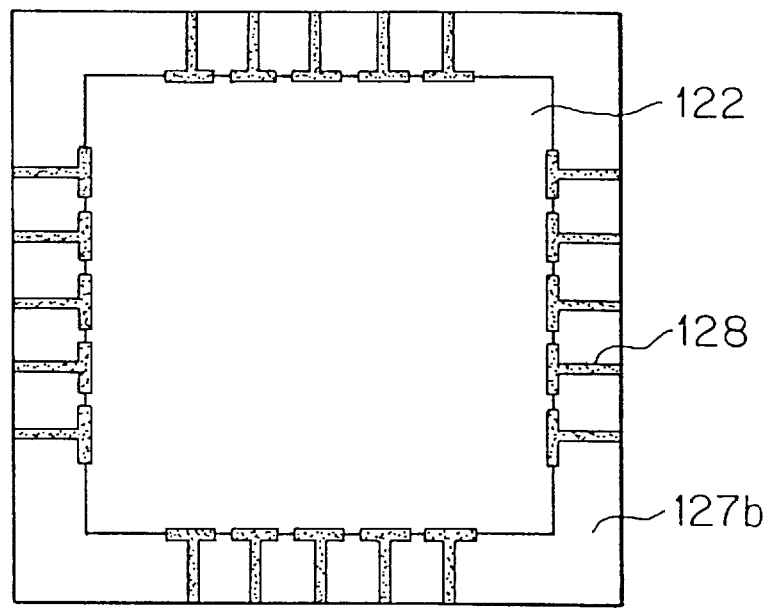
FIGS. 15($a$) and 15($b$) are top and side views, respectively, of an embodiment of a PCB structure in accordance with the present invention.
Figure 15B:
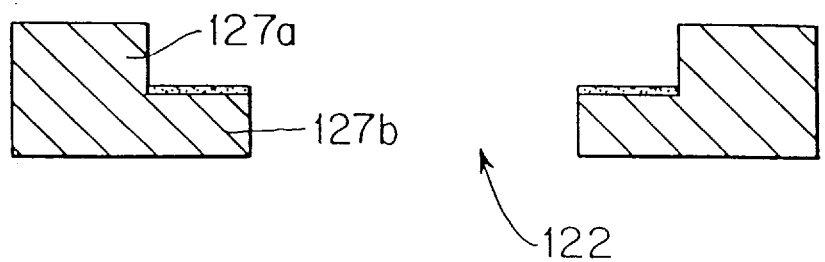
Figure 16A:
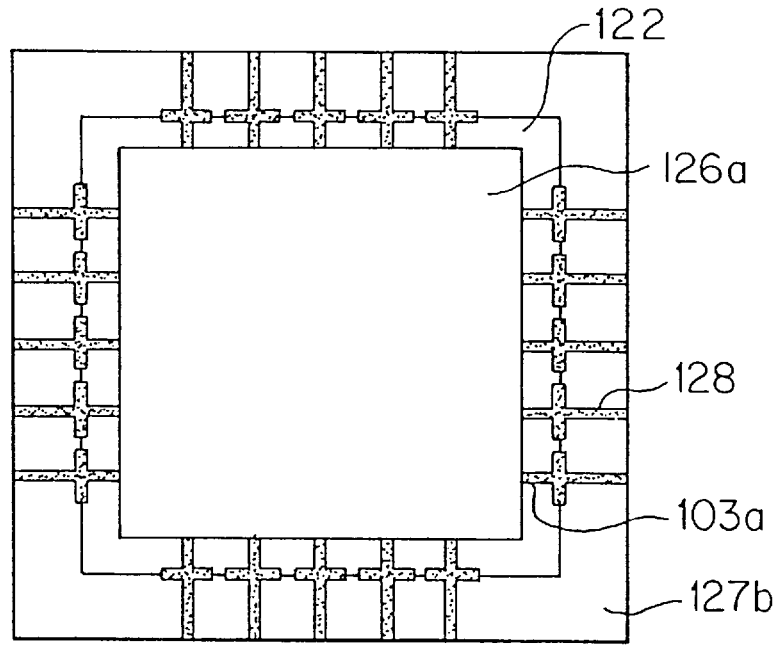
FIGS. 16($a$) and 16($b$) are top and side views, respectively, of the low profile semiconductor die carrier of FIGS. 14($a$) and 14($b$) secured to the structure of FIGS. 15($a$) and 15($b$).
Figure 16B:
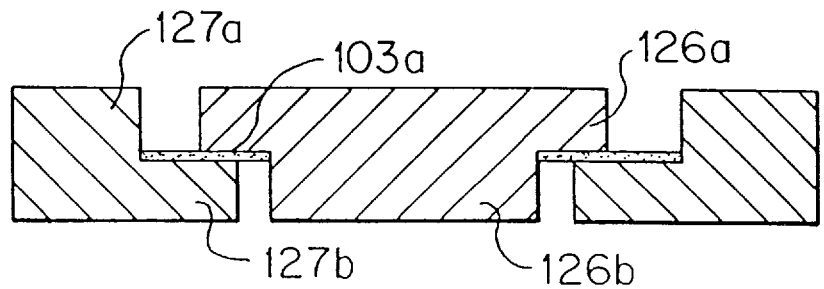

FIGS. 14(a) and 14(b) are different views of a simplified version of the stepped semiconductor die carrier depicted in FIG. 13(b); FIGS. 15(a) and 15(b) are different views of a simplified version of the PCB 119 depicted in FIG. 13(b); and FIGS. 16(a) and 16(b) are different views showing the simplified semiconductor die carrier of FIGS. 14(a) and 14(b) secured to the simplified PCB structure of FIGS. 15(a) and 15(b). Although these figures illustrate only a single-step embodiment, the features depicted in such figures are equally applicable to embodiments (such as the one shown in FIG. 13(b)) using semiconductor die carriers and/or apertures having multiple steps. For example, the present invention contemplates embodiments having one, two, three, four, or more steps.

The semiconductor die carrier of FIGS. 14(a) and 14(b) includes an upper step 126a and a lower step 126b on each of the four sides of the die carrier. A plurality of straight leads 103a are formed on the lower surface of each step 126a.

As with the semiconductor die carrier of FIGS. 14(a) and 14(b), the aperture 122 of PCB 119 shown in FIGS. 15(a) and 15(b) is stepped. More particularly, aperture 122 of FIGS. 15(a) and 15(b) includes an upper step 127a and a lower step 127b around each of the sides of its periphery. T-shaped circuit land connections 128 formed on an upper surface of step 127b serve as electrically conductive contacts configured to be connected (e.g., soldered) to leads 103a of the semiconductor die carrier of FIGS. 14(a) and 14(b).

FIGS. 16(a) and 16(b) illustrate that when the semiconductor die carrier of FIGS. 14(a) and 14(b) is plugged into the aperture 122 of PCB 119 of FIGS. 15(a) and 15(b), straight leads 103a are preferably perfectly aligned with T-shaped circuit land connections 128. The combination of straight leads 103a and T-shaped circuit land connections 128 is not only very easy to align, it also provides a reasonable amount of self-alignment during the time that the solder connecting such components is in its liquid phase, due primarily to the surface tension of the solder and the unique intersection at the T-shaped land connections.

Figure 17A:
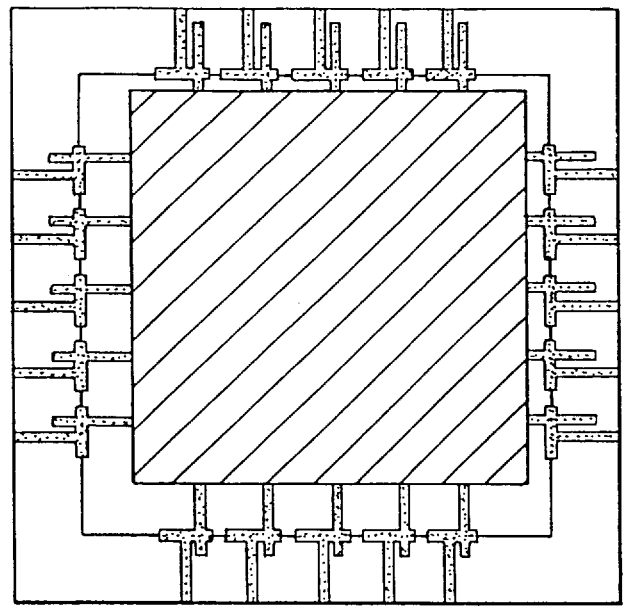
FIGS. 17($a$) and 17($b$) are top views of the low profile semiconductor die carrier of FIGS. 14($a$) and 14($b$) secured to the PCB structure of FIGS. 15($a$) and 15($b$), illustrating tolerance characteristics.
Figure 17B:
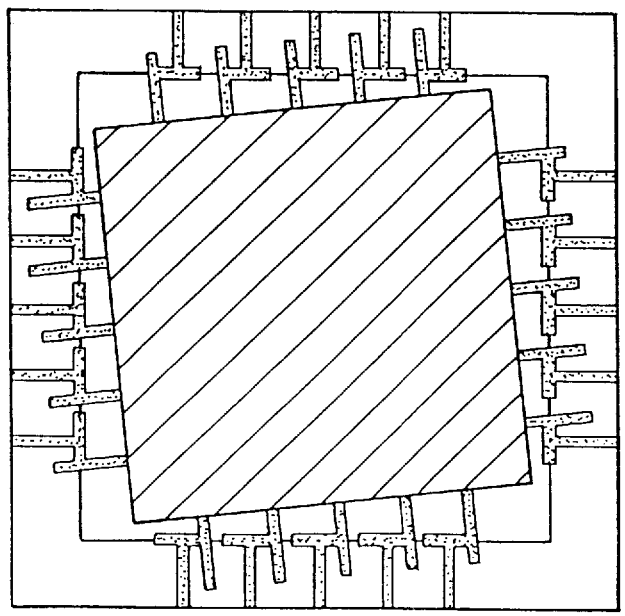

The T-shaped configuration of the circuit land connections 128 is also particularly beneficial in cases such as depicted in FIGS. 17(a) and 17(b), where the semiconductor die carrier and aperture 172 are not perfectly aligned. As can be seen from these figures, even in the case where the semiconductor die carrier and PCB aperture 122 are not perfectly aligned, the T-shape of circuit lands 128 provides an adequate amount of tolerance so that lead-to-land connections are still accurately provided. It should be noted that the design of the T and its corresponding finger must be so at to optimize solder placement, especially for self-alignment, while at the same time, must be configured to prevent bonding between adjacent T-shaped lands either by solder and/or the placed semiconductor die carrier leads 103a.

As discussed above, the present invention provides many advantages over conventional packaging technology. Such advantages include the provision of a semiconductor die carrier occupying reduced amounts of area, having a low profile, and capable of meeting the needs of existing and contemplated semiconductor and computer technology. The advantages provided by the present invention over conventional packaging technology illustrate that the present invention, unlike conventional packaging technology, is capable of keeping pace with the rapid advances that are currently taking place in the semiconductor and computer technologies.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and example be considered as exemplary only, with a true scope and spirit of the invention being indicated by the following claims.

What is claimed is:

1. A semiconductor die carrier configured to be secured to a printed circuit board having a first side and a second side opposite to the first side, the semiconductor die carrier comprising:

a housing for a semiconductor die, the housing having a top surface, a bottom surface, and a plurality of lateral surfaces coupling the top surface and the bottom surface;

a first row of conductive leads extending from at least one of the lateral surfaces of the housing; and a second row of conductive leads extending from the at least one lateral surface of the housing, each of the leads of the first and second rows of conductive leads having a proximal end and a distal end having a contact surface, the proximal ends of the leads from the first row of leads being vertically spaced from the proximal ends of the leads from the second row of leads, and the contact surfaces of the leads from the first and second rows of leads in their entirety being substantially coplanar and being configured to be secured to the first side of the printed circuit board such that, when the contact surfaces of the leads are secured to the first side of the printed circuit board, at least a portion of the housing is located below an upper surface of the first side of the printed circuit board.

2. The semiconductor die carrier according to claim 1, further comprising a third row of leads extending from the at least one lateral surface of the housing, each of the leads of the third row of leads having a proximal end and a distal end having a contact surface, and the proximal ends of the leads of the third row of leads being vertically spaced from the proximal ends of the leads from the first and second rows of leads.

3. A printed circuit board structure comprising:

a printed circuit board; and a semiconductor die carrier secured to a first side of the printed circuit board, the semiconductor die carrier comprising:

a housing for a semiconductor die, the housing having a top surface, a bottom surface, and a plurality of lateral surfaces coupling the top surface and the bottom surface;

a first row of conductive leads extending from at least one of the lateral surfaces of the housing; and a second row of conductive leads extending from the at least one lateral surface of the housing, each of the leads of the first and second rows of conductive leads having a proximal end and a distal end having a contact surface, the proximal ends of the leads from the first row of leads being vertically spaced from the proximal ends of the leads from the second row of leads, and the contact surfaces of the leads from the first and second rows of leads in their entirety being substantially coplanar and being configured to be secured to the first side of the printed circuit board such that, when the contact surfaces of the leads are secured to the first side of the printed circuit board, at least a portion of the housing is located below an upper surface of the first side of the printed circuit board.

4. The printed circuit board structure according to claim 3, the semiconductor die carrier further comprising a third row of leads extending from the at least one lateral surface of the housing, each of the leads of the third row of leads having a proximal end and a distal end having a contact surface, and the proximal ends of the leads of the third row of leads being vertically spaced from the proximal ends of the leads from the first and second rows of leads.

5. A semiconductor die carrier configured to be secured to a printed circuit board, the semiconductor die carrier comprising:

a housing for a semiconductor die, the housing having a top surface, a bottom surface, and a plurality of stepped outer side surfaces coupling the top surface and the bottom surface, and each of the outer side surfaces comprising at least a first step and a second step;

a first row of conductive leads extending from the first step of at least one of the outer side surfaces of the housing; and a second row of conductive leads extending from the second step of the at least one outer side surface of the housing, each of the leads of the first and second rows of conductive leads having a proximal end and a distal end, the proximal ends of the leads of the second row of leads being vertically spaced from the proximal ends of the leads of the first row of leads by at least one of the steps, and the distal ends of the leads of the first and second rows of leads being configured to be secured to the printed circuit board such that, when the distal ends of the leads are secured to the printed circuit board, at least a portion of the housing is located below an upper surface of the printed circuit board.

6. The semiconductor die carrier according to claim 5, wherein the leads of the second row of leads extend out from the at least one outer side surface of the housing further than the leads of the first row of leads.

7. The semiconductor die carrier according to claim 5, wherein each of the outer side surfaces further comprises a third step, and the semiconductor die carrier further comprises a third row of conductive leads extending from the third step of the at least one outer side surface of the housing, each of the leads of the third row of leads having a proximal end and a distal end, the proximal ends of the leads of the third row of leads being vertically spaced from the proximal ends of the leads of the second row of leads by at least one of the steps, and the proximal ends of the leads of the third row of leads being vertically spaced from the proximal ends of the leads of the first row of leads by at least two of the steps.

8. A printed circuit board structure comprising:

a printed circuit board including a stepped aperture and a plurality of electrically conductive contacts associated with the stepped aperture; and a semiconductor die carrier secured to the printed circuit board, the semiconductor die carrier comprising a housing for a semiconductor die, the housing having a top surface, a bottom surface, and a plurality of stepped outer side surfaces coupling the top surface and the bottom surface, and each of the outer side surfaces comprising at least a first step and a second step;

a first row of conductive leads extending from the first step of at least one of the outer side surfaces of the housing; and a second row of conductive leads extending from the second step of the at least one outer side surface of the housing, each of the leads having a proximal end and a distal end, the proximal ends of the leads of the second row of leads being vertically spaced from the proximal ends of the first row of leads by at least one of the steps of the at least one outer side surface of the housing, and the distal ends of the leads of the first and second rows of leads being configured to be secured to the electrically conductive contacts of the printed circuit board, respectively, such that when the distal ends of the leads are secured to the electrically conductive contacts, at least a portion of the housing is located below an upper surface of the printed circuit board.

9. The printed circuit board structure according to claim 8, wherein the leads of the second row of leads extend out from the at least one outer side surface of the housing further than the leads of the first row of leads.

10. The printed circuit board structure according to claim 8, wherein each of the outer side surfaces further comprises a third step, and the semiconductor die carrier further comprises a third row of conductive leads extending from the third step of the at least one outer side surface of the housing, each of the leads of the third row of leads having a proximal end and a distal end, the proximal ends of the leads of the third row of leads being vertically spaced from the proximal ends of the leads of the second row of leads by at least one of the steps, and the proximal ends of the leads of the third row of leads being vertically spaced from the proximal ends of the leads of the first row of leads by at least two of the steps.

11. The printed circuit board structure according to claim 8, wherein the stepped aperture of the printed circuit board comprises at least one step, and at least one of the plurality of electrically conductive contacts is formed on each step of the aperture.

12. The printed circuit board structure according to claim 11, wherein each of the electrically conductive contacts comprises at least one extension portion for providing tolerance with respect to securement of the semiconductor die carrier to the printed circuit board.

13. The printed circuit board structure according to claim 11, wherein each of the electrically conductive contacts comprises a T-shaped member for providing tolerance with respect to securement of the semiconductor die carrier to the printed circuit board.

14. A semiconductor die carrier configured to be secured to a printed circuit board having a planar upper surface and a recess in the planar upper surface, the semiconductor die carrier comprising:

a housing for a semiconductor die, the housing having a top surface, a bottom surface, and a plurality of side surfaces coupling the top surface and the bottom surface;

a first row of electrically conductive leads extending from at least one of the side surfaces of the housing, each of the leads of the first row of leads comprising a contact surface;

a second row of electrically conductive leads extending from said at least one of the side surfaces of the housing, each of the leads of the second row of leads comprising a contact surface, said second row of leads being vertically spaced from said first row of leads; and wherein the contact surfaces of the leads of the first and second rows of leads are substantially coplanar and are configured to be secured to the planar upper surface of the printed circuit board such that, when the contact surfaces of the leads of the first and second rows are secured to the planar upper surface of the printed circuit board, at least a portion of the housing is located below the planar upper surface of the printed circuit board.

15. The semiconductor die carrier according to claim 14, wherein each of the leads of at least one of the first and second rows of leads comprises a substantially horizontal portion and a substantially vertical portion, said substantially horizontal portion and said substantially vertical portion forming a right angle.

16. The semiconductor die carrier according to claim 14, wherein each of the leads of at least one of the first and second rows of leads comprises a substantially horizontal portion and a substantially vertical portion, said substantially horizontal portion and said substantially vertical portion forming an obtuse angle.

17. A semiconductor die carrier comprising:

a housing for a semiconductor die, the housing having a top surface, a bottom surface, and a plurality of lateral surfaces coupling the top surface and the bottom surface; and first and second rows of conductive leads extending from at least one of the lateral surfaces of the housing, wherein the first row of conductive leads is vertically spaced from the second row of conductive leads on the at least one lateral surface and wherein the leads of the first and second rows of conductive leads have contact portions for contacting a single horizontal planar surface on a first side of a printed circuit board such that, when the contact portions of the leads contact the horizontal planar surface of the first side of the printed circuit board, at least a portion of the housing is located below the horizontal planar surface of the first side of the printed circuit board.

18. A semiconductor die carrier configured to be secured to a printed circuit board, the semiconductor die carrier comprising:

an insulative package for housing a semiconductor die, the insulative package having a top surface, a bottom surface, and a plurality of outer side surfaces coupling the top surface and the bottom surface, and at least one of the outer side surfaces being stepped;

a first row of electrically conductive leads extending from the at least one of the outer side surfaces of the insulative package;

a second row of electrically conductive leads extending from the at least one of the outer side surfaces of the insulative package, each of the leads of the first and second rows having a contact end, said second row of leads being vertically spaced from said first row of leads; and wherein the contact ends of the leads of both of the first and second rows being configured to be secured to an upper surface of the printed circuit board such that, when the contact ends of the leads are secured to the upper surface of the printed circuit board, at least a portion of the insulative package is located below the upper surface of the printed circuit board.

19. A semiconductor die carrier configured to be secured to a printed circuit board, the semiconductor die carrier comprising:

a housing for a semiconductor die, the housing having a top surface, a bottom surface, and a plurality of side surfaces coupling the top surface and the bottom surface;

a first row of electrically conductive leads extending from at least one of the side surfaces of the housing, each of the leads of the first row of leads comprising a horizontal portion extending from the at least one side surface in a horizontal direction, a substantially vertical portion extending from the horizontal portion in a substantially vertical direction, and a distal end;

a second row of electrically conductive leads extending from the at least one side surface of the housing, each of the leads of the second row of electrically conductive leads comprising a horizontal portion extending from the at least one side surface in a horizontal direction, a substantially vertical portion extending from the horizontal portion in a substantially vertical direction, and a distal end; and the distal ends of the leads of the first and second rows being substantially coplanar and being configured to be secured to the upper surface of the printed circuit board such that, when the distal ends of the leads are secured to the upper surface of the printed circuit board, at least a portion of the housing is located below the upper surface of the printed circuit board and at least part of the horizontal portion of each of the leads of the first row of leads extends over the upper surface of the printed circuit board.

20. A semiconductor die carrier configured to be secured to a printed circuit board, the semiconductor die carrier comprising:

a housing for a semiconductor die, the housing having a top surface, a bottom surface, and a plurality of side surfaces coupling the top surface and the bottom surface;

a first row of electrically conductive leads extending from at least one of the side surfaces of the housing, each of the leads of the first row of leads comprising a horizontal portion extending from the at least one side surface in a horizontal direction, a substantially vertical portion extending from the horizontal portion in a substantially vertical direction, and a distal end;

a second row of electrically conductive leads extending from the at least one side surface of the housing, each of the leads of the second row of electrically conductive leads comprising a horizontal portion extending from the at least one side surface in a horizontal direction, the horizontal portion having a distal end; and the distal ends of the leads of the first and second rows being substantially coplanar and being configured to be secured to the upper surface of the printed circuit board such that, when the distal ends of the leads are secured to the upper surface of the printed circuit board, at least a portion of the housing is located below the upper surface of the printed circuit board and at least part of the horizontal portion of each of the leads of the first row of leads extends over the upper surface of the printed circuit board.

21. A semiconductor die carrier configured to be secured to a printed circuit board having a first side and a second side opposite to the first side, the semiconductor die carrier comprising:

a housing for a semiconductor die, the housing having a top surface, a bottom surface, and a plurality of lateral surfaces coupling the top surface and the bottom surface;

a first row of conductive leads extending from at least one of the lateral surfaces of the housing; and a second row of conductive leads extending from the at least one lateral surface of the housing, each of the leads of the first and second rows of conductive leads having a proximal end and a distal end, the proximal ends of the leads from the first row of leads being vertically spaced from the proximal ends of the leads from the second row of leads, and the distal ends of the leads from both the first and second rows of leads lying in a horizontal plane and being configured to be secured to the first side of the printed circuit board such that, when the distal ends of the leads are secured to the first side of the printed circuit board, at least a portion of the housing is located below an upper surface of the first side of the printed circuit board.

22. A semiconductor die carrier according to claim 21, further comprising a third row of leads extending from the at least one lateral surface of the housing, each of the leads of the third row of leads having a proximal end and a distal end, and the proximal ends of the leads of the third row of leads being vertically spaced from the proximal ends of the leads from the first and second rows of leads.

23. A semiconductor die carrier according to claim 21, wherein each of the leads of the first row of leads comprises a substantially horizontal portion and a substantially vertical portion joined to said substantially horizontal portion.

24. A semiconductor die carrier according to claim 21, wherein the distal end of each of the leads of the first row of leads comprises a horizontally extending foot portion, said foot portion being configured to be secured to the first side of the printed circuit board.

25. A printed circuit board structure comprising:

a printed circuit board; and a semiconductor die carrier secured to a first side of the printed circuit board, the semiconductor die carrier comprising:

a housing for a semiconductor die, the housing having a top surface, a bottom surface, and a plurality of lateral surfaces coupling the top surface and the bottom surface;

a first row of conductive leads extending from at least one of the lateral surfaces of the housing; and a second row of conductive leads extending from the at least one lateral surface of the housing, each of the leads of the first and second rows of conductive leads having a proximal end and a distal end, the proximal ends of the leads from the first row of leads being vertically spaced from the proximal ends of the leads from the second row of leads, and the distal ends of the leads from both the first and second rows of leads lying in a horizontal plane and being configured to be secured to a first side of the printed circuit board such that, when the distal ends of the leads are secured to the first side of the printed circuit board, at least a portion of the housing is located below an upper surface of the first side of the printed circuit board.

26. A semiconductor die carrier according to claim 25, further comprising a third row of leads extending from the at least one lateral surface of the housing, each of the leads of the third row of leads having a proximal end and a distal end, and the proximal ends of the leads of the third row of leads being vertically spaced from the proximal ends of the leads from the first and second rows of leads.

27. A semiconductor die carrier according to claim 25, wherein each of the leads of the first row of leads comprises a substantially horizontal portion and a substantially vertical portion joined to said substantially horizontal portion.

28. A semiconductor die carrier according to claim 25, wherein the distal end of each of the leads of the first row of leads comprises a horizontally extending foot portion, said foot portion being configured to be secured to the first side of the printed circuit board.

29. A semiconductor die carrier, the semiconductor die carrier comprising:

a housing for a semiconductor die, the housing having a top surface, a bottom surface, and a plurality of lateral surfaces coupling the top surface and the bottom surface; and first and second rows of conductive leads extending from at least one of the lateral surfaces of the housing, wherein the first row of conductive leads is vertically spaced from the second row of conductive leads on the at least one lateral surface and wherein each of the leads of the first and second rows of conductive leads has a contact portion for contacting a contact surface on a first side of a printed circuit board, the contact portions of both the first and second rows of leads lying in a horizontal plane such that, when the contact portions of the leads contact the contact surface of the first side of the printed circuit board, at least a portion of the housing is located below the contact surface of the first side of the printed circuit board.

30. A semiconductor die carrier according to claim 29, further comprising a third row of leads extending from the at least one lateral surface of the housing, each of the leads of the third row of leads having a contact portion, the third row of leads being vertically spaced from the first and second rows of leads.

31. A semiconductor die carrier according to claim 29, wherein each of the leads of the first row of leads comprises a substantially horizontal portion and a substantially vertical portion joined to said substantially horizontal portion.

32. A semiconductor die carrier according to claim 29, wherein the contact portion of each of the leads of the first row of leads comprises a horizontally extending foot portion for contacting a contact surface on the first side of the printed circuit board.

* * * * *